(12) United States Patent
Choi (10) Patent No.: US 7,843,132 B2
(45) Date of Patent: Nov. 30, 2010

(54) DISPLAY DEVICE HAVING LIGHT EMITTING ELEMENT

(75) Inventor: Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 417 days.

(21) Appl. No.: 11/677,369

(22) Filed: Feb. 21, 2007

(65) Prior Publication Data

US 2007/0194707 A1 Aug. 23, 2007

(30) Foreign Application Priority Data

Feb. 22, 2006 (KR) .................. 10-2006-0017083

(51) Int. Cl.
*H05B 51/00* (2006.01)
(52) U.S. Cl. ..................................... 313/506
(58) Field of Classification Search ................. 313/506, 313/512
See application file for complete search history.

(56) References Cited

U.S. PATENT DOCUMENTS 6,489,631 B2   12/2002   Young et al.
6,933,532 B2 *  8/2005   Arnold et al. ................ 257/80
2004/0150595 A1 *  8/2004   Kasai ........................ 345/82
2004/0222736 A1 * 11/2004   Yoneda ...................... 313/503
2005/0248264 A1 * 11/2005   Cok .......................... 313/504

FOREIGN PATENT DOCUMENTS

| JP | 2004-227851 | 8/2004 |
| JP | 2005-019353 | 1/2005 |
| JP | 2005-019373 | 1/2005 |
| JP | 2005-208582 | 8/2005 |
| KR | 1020010083213 | 8/2001 |
| KR | 1020040085025 | 10/2004 |
| KR | 1020040106806 | 12/2004 |
| KR | 1020050039557 | 4/2005 |

* cited by examiner

*Primary Examiner*—Toan Ton
*Assistant Examiner*—Hana S Featherly
(74) *Attorney, Agent, or Firm*—Cantor Colburn LLP (57) ABSTRACT

A display device according to an exemplary embodiment of the invention and a method of forming the same include light emitting elements each having an organic light emitting layer emitting white light, a plurality of driving transistors which supply a driving current to the light emitting elements so as to cause the light emitting elements to emit light, photo sensing parts which detect light amounts according to emission of light from the light emitting elements and output sense signals according to the detected light amounts, and color filters formed on the driving transistors and the photo sensing parts.

10 Claims, 5 Drawing Sheets

| R | W | R | W |
|---|---|---|---|
| G | B | G | B |
| R | W | R | W |
| G | B | G | B |

DISPLAY DEVICE HAVING LIGHT EMITTING ELEMENT

This application claims priority to Korean Patent Application No. 10-2006-0017083, filed on Feb. 22, 2006, and all the benefits accruing therefrom under 35 U.S.C. §119, the contents of which in its entirety are herein incorporated by reference.

BACKGROUND OF THE INVENTION (a) Field of the Invention

The present invention relates to a display device, more particularly, to a display device having a photo sensing function.

(b) Description of the Related Art

In recent years, lightweight and thin monitors or televisions are increasingly required or desired, and liquid crystal displays ("LCDs") which are lightweight and thin are being substituted for conventional cathode ray tubes ("CRTs").

However, since the LCD is a light receiving/emitting device, a separate backlight or light reflector is required. In addition, LCDs have many problems including slow response speed, a limited viewing angle, low contrast ratios, as well as other problems. Recently, an organic light emitting diode ("OLED") display is attracting attention as a display device which can overcome these problems.

An OLED display includes two electrodes and a light emitting layer interposed therebetween. The light emitting layer combines electrons injected from one electrode and holes injected from the other electrode to form excitons, which emit light through energy emission. The OLED display is a display device which electrically excites a fluorescent organic material to emit light so as to display images. Since an OLED display is itself a light emitting display device which does not require a separate backlight or light reflector, it provides for lower power consumption, wider viewing angles and faster pixel response speeds, making it suitable to display high-quality motion pictures.

The organic light emitting diode ("OLED") display includes organic light emitting elements (e.g., organic light emitting diodes, "OLEDs") and thin film transistors ("TFTs") which drive the organic light emitting elements. The (TFTs) are classified into several types including polysilicon TFTs, amorphous silicon TFTs, and so on, according to the type of active layer. An OLED display using the polysilicon thin film transistor has many merits and is widely used, but the manufacturing process of the polysilicon TFT is complex, which causes an increase in manufacturing costs. Also, a large screen cannot be achieved using such an OLED display.

Meanwhile, a large screen is easily achieved using an OLED display using amorphous silicon TFTs. Also, the manufacturing process of an OLED display using the amorphous silicon is much simpler when compared with an OLED display using the polysilicon thin film transistor.

However, as a positive DC voltage is continuously applied to a control terminal of the amorphous silicon TFT, the threshold voltage of the amorphous silicon thin film transistor changes. Even though a constant control voltage is applied to the TFTs, non-uniform currents flow within the OLEDs. For this reason, luminance of the OLED display is lowered, which causes degradation in image quality. Ultimately, the non-uniform currents within the OLEDs cause a reduction in a life span of the OLED display.

Up to now, various pixel circuits, which compensate for the variations of threshold voltages, have been suggested in order to prevent the degradation in image quality. However, most of the pixel circuits include many thin film transistors, capacitors and wiring, which results in a low pixel aperture ratio.

Accordingly, there remains a desire to prevent degradation in image quality by correcting a change in threshold voltage of an amorphous silicon TFT.

BRIEF SUMMARY OF THE INVENTION

The present invention has been made in an effort to provide an organic light emitting diode ("OLED") display, having aspects, features and advantages of stably realizing a structure for correcting a change in threshold voltage.

An exemplary embodiment of the display device includes; a plurality of light emitting elements each having an organic light emitting layer which emit white light when supplied with a driving current, a plurality of driving transistors which supply the driving current to the light emitting elements a plurality of photo sensing parts which detect light amounts according to light emitted from the light emitting elements and output sense signals according to the sensed light amounts, and a plurality of color filters formed on the driving transistors and the photo sensing parts.

One exemplary embodiment of a display device may further include an overcoat formed on the color filters.

One exemplary embodiment of an organic light emitting layer may include a first layer, a second layer and a third layer which emit light of different colors.

In one exemplary embodiment, the first layer, the second layer or the third layer may emit light of one of red, blue and green.

In another exemplary embodiment, the first layer may emit blue light, the second layer may emit green light and the third layer may emit red light.

In one exemplary embodiment, each of the photo sensing parts may include a sensor transistor which forms a photocurrent according to the emission of the corresponding light emitting element.

One exemplary embodiment of a display device may further include a plurality of first capacitors which charge an image data voltage corresponding to the driving current, and a plurality of second capacitors which charge a sensing reference voltage and discharge a predetermined voltage corresponding to the photocurrent.

One exemplary embodiment of a display device may further include a plurality of first switching transistors which transmits the image data voltage to the first capacitors and the driving transistors according to scanning signals, and a plurality of second switching transistors which transmits the sensing reference voltage to the second capacitors and the sensor transistors according to the scanning signal.

One exemplary embodiment of a display device may further include a plurality of scanning signal lines which are respectively connected to the first and second switching transistors and transmit the scanning signals, a plurality of image data lines which are respectively connected to the first switching transistors and transmit the image data voltage, and a plurality of sensing data lines which are respectively connected to the second switching transistors and transmit the sensing reference voltage.

One exemplary embodiment of a display device may further include a luminance detector which is connected to the sensing data lines so as to supply the sensing reference voltage to the sensing data lines, and detects the magnitude of a voltage charged in each of the second capacitors so as to generate luminance information about the light emitting element.

BRIEF DESCRIPTION OF THE DRAWINGS

The present invention will become more apparent by describing preferred exemplary embodiments thereof in more detail with reference to the accompanying drawings, in which.

DETAILED DESCRIPTION OF THE INVENTION

The present invention will now be described more fully hereinafter with reference to the accompanying drawings, in which exemplary embodiments of the present invention are shown. Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element or layer, the element or layer can be directly on or connected to another element or layer or intervening elements or layers that may also be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

A display device according to an exemplary embodiment of the present invention will now be described in more detail with reference to the accompanying drawings.

An exemplary embodiment of an organic light emitting diode ("OLED") display according to the present invention will be described first in more detail with reference to FIGS. 1 and 2.

Figure 1:
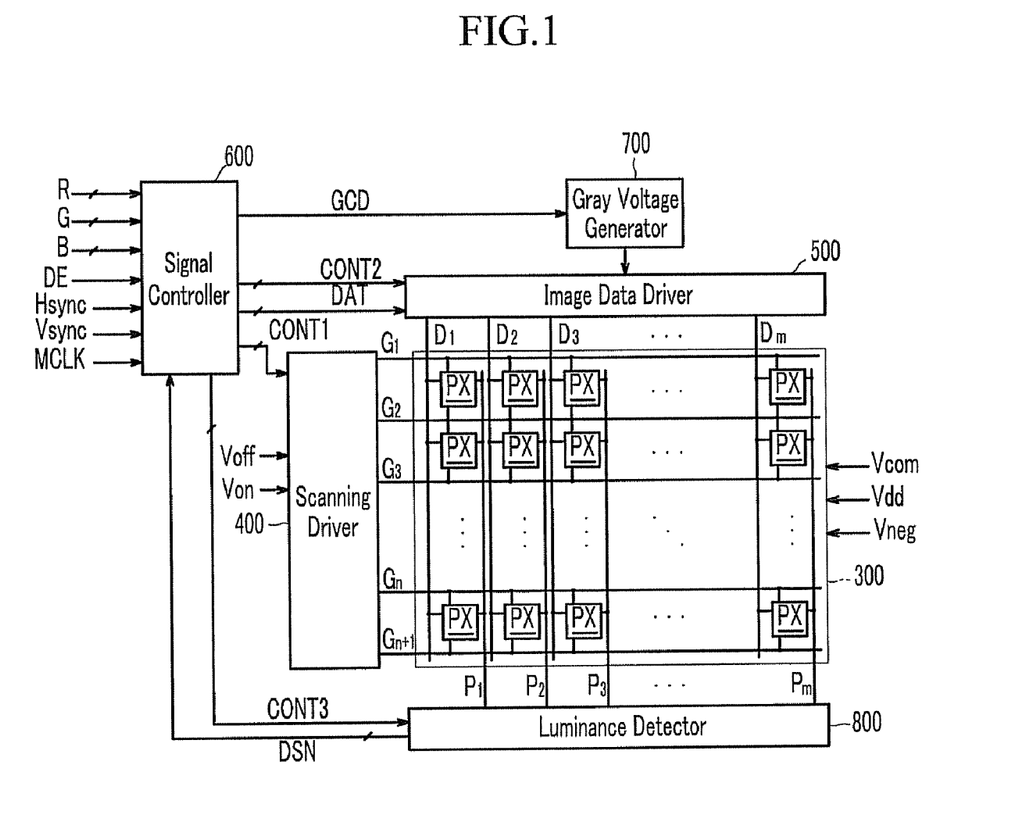
FIG. 1 is a block diagram showing an exemplary embodiment of an organic light emitting diode ("OLED") display according to the present invention.

FIG. 1 is a block diagram of an OLED display according to an exemplary embodiment of the present invention. FIG. 2 is an equivalent circuit diagram of one pixel in the OLED display according to an exemplary embodiment of the present invention.

As shown in FIG. 1, an exemplary embodiment of an OLED display according to the present invention includes a display panel 300, a scanning driver 400, an image data driver 500 and a luminance detector 800 which are connected to the display panel 300, a gray voltage generator 700 which is connected to the image data driver 500, the gray voltage generator 700, the luminance detector 800, and a signal controller 600.

Figure 2:
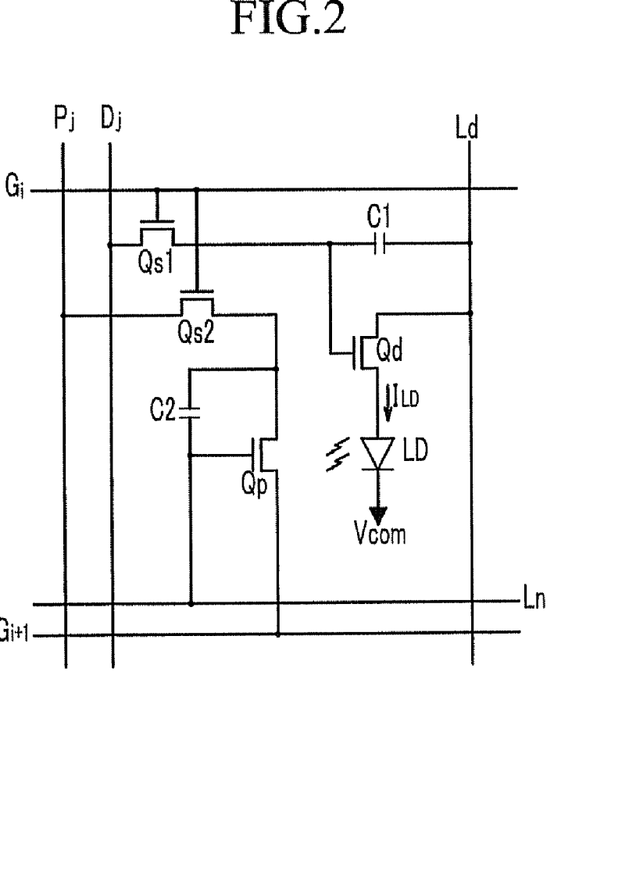
FIG. 2 is an equivalent circuit diagram showing an exemplary embodiment of one pixel in the OLED display according to the present invention.

Referring to FIG. 1 and FIG. 2, the display panel 300 includes a plurality of signal lines $G_1$ to $G_{n+1}$, $D_1$ to $D_m$, $P_1$ to $P_m$, Ld, and Ln, and a plurality of pixels PX which are connected to the signal lines and are substantially arranged in a matrix shape.

The signal lines $G_1$ to $G_{n+1}$, $D_1$ to $D_m$, and $P_1$ to $P_m$ include a plurality of scanning signal lines $G_1$ to $G_{n+1}$ which transmit scanning signals, a plurality of image data lines $D_1$ to $D_m$ which transmit an image data voltage, and a plurality of sensing data lines $P_1$ to $P_m$ which transmit a sensing reference voltage. The scanning signal lines $G_1$ to $G_{n+1}$ substantially extend in a row direction substantially parallel with one another, and the image data lines $D_1$ to $D_m$ and the sensing data lines $P_1$ to $P_m$ substantially extend in a column direction substantially parallel with one another.

The signal lines Ld and Ln include a driving voltage line Ld which transmits a driving voltage Vdd and a control voltage line Ln which transmits a control voltage Vneg, and extend in a row or column direction.

Referring to FIG. 2, each pixel PX is connected to the scanning signal line $G_i$ of the i-th pixel row and the image data line $D_j$ of the j-th pixel column includes an organic light emitting diode ("OLED") LD, a driving transistor Qd, a sensor transistor Qp, first and second capacitors C1 and C2, and first and second switching transistors Qs1 and Qs2, respectively.

The driving transistor Qd is a three terminal element, such as a thin film transistor. A control terminal of the driving transistor Qd is connected to the first switching transistor Qs1 and the first capacitor C1, and an input terminal and an output terminal thereof are respectively connected to the driving voltage line Ld and the OLED LD.

The first switching transistor Qs1 is also a three terminal element. A control terminal and an input terminal of the first switching transistor Qs1 are respectively connected to the scanning signal line $G_i$ and the image data line $D_j$, and an output terminal thereof is connected to the first capacitor C1 and the driving transistor Qd.

Referring to FIGS. 1 and 2, the first capacitor C1 is connected between the first switching transistor Qs1 and the driving voltage Vdd. The first capacitor C1 charges the image data voltage from the first switching transistor Qs1 and holds the image data voltage for a predetermined amount of time.

An anode and a cathode of the OLED LD are respectively connected to the driving transistor Qd and the common voltage Vcom. The OLED LD emits light with different intensities according to the magnitude of a current $I_{LD}$ supplied from the driving transistor Qd, so as to display images. The magnitude of the current $I_{LD}$ depends on the magnitude of a voltage Vgs between the control terminal and the output terminal of the driving transistor Qd.

The sensor transistor Qp is also a three terminal element. A control terminal of the sensor transistor Qp is connected to the control voltage line Ln, an input terminal thereof is connected to the second switching transistor Qs2, and an output terminal thereof is connected to the scanning signal line $G_{i+1}$ of the $(i+1)^{th}$ pixel row (hereinafter referred to as a next scanning signal line). As the organic light emitting diode ("OLED") LD emits light, a channel semiconductor of the sensor transistor Qp which is disposed below the OLED LD receives light from the OLED LD so as to form the photocurrent, and outputs the photocurrent to the output terminal according to a difference in voltage between the input terminal and the output terminal of the sensor transistor Qp.

The second switching transistor Qs2 is also a three terminal element. A control terminal and an input terminal of the second switching transistor Qs2 are respectively connected to the scanning signal line $G_i$ and the sensing data line $P_j$, and an output terminal thereof is connected to the sensor transistor Qp. The second switching transistor Qs2 transmits the sensing reference voltage from the sensing data line $P_j$ to the second capacitor C2.

The second capacitor C2 is connected between the control terminal and the input terminal of the sensor transistor Qp. The second capacitor C2 receives and charges the sensing reference voltage from the second switching transistor Qs2, and discharges a predetermined voltage to the control terminal of the sensor transistor Qp and the control voltage line Ln, corresponding to the magnitude of the photocurrent as the sensor transistor Qp flows the photocurrent.

A structure of the organic light emitting diode ("OLED") display will now be described in more detail with reference to FIGS. 3 to 7.

Figure 3:
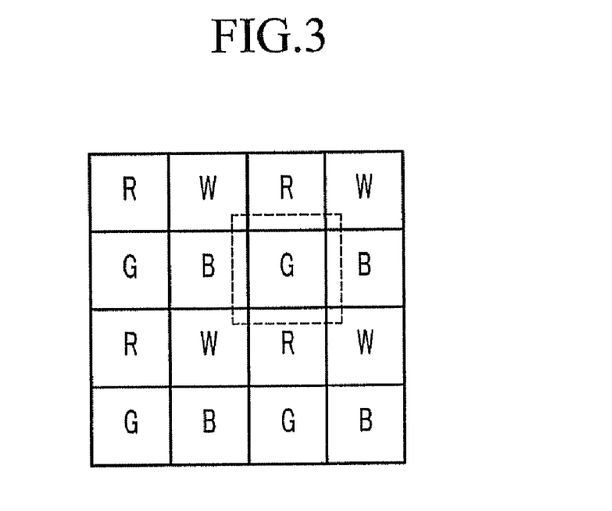
FIG. 3 is a plan view showing an exemplary embodiment of a plurality of pixels in the OLED display according to the present invention.
Figure 4:
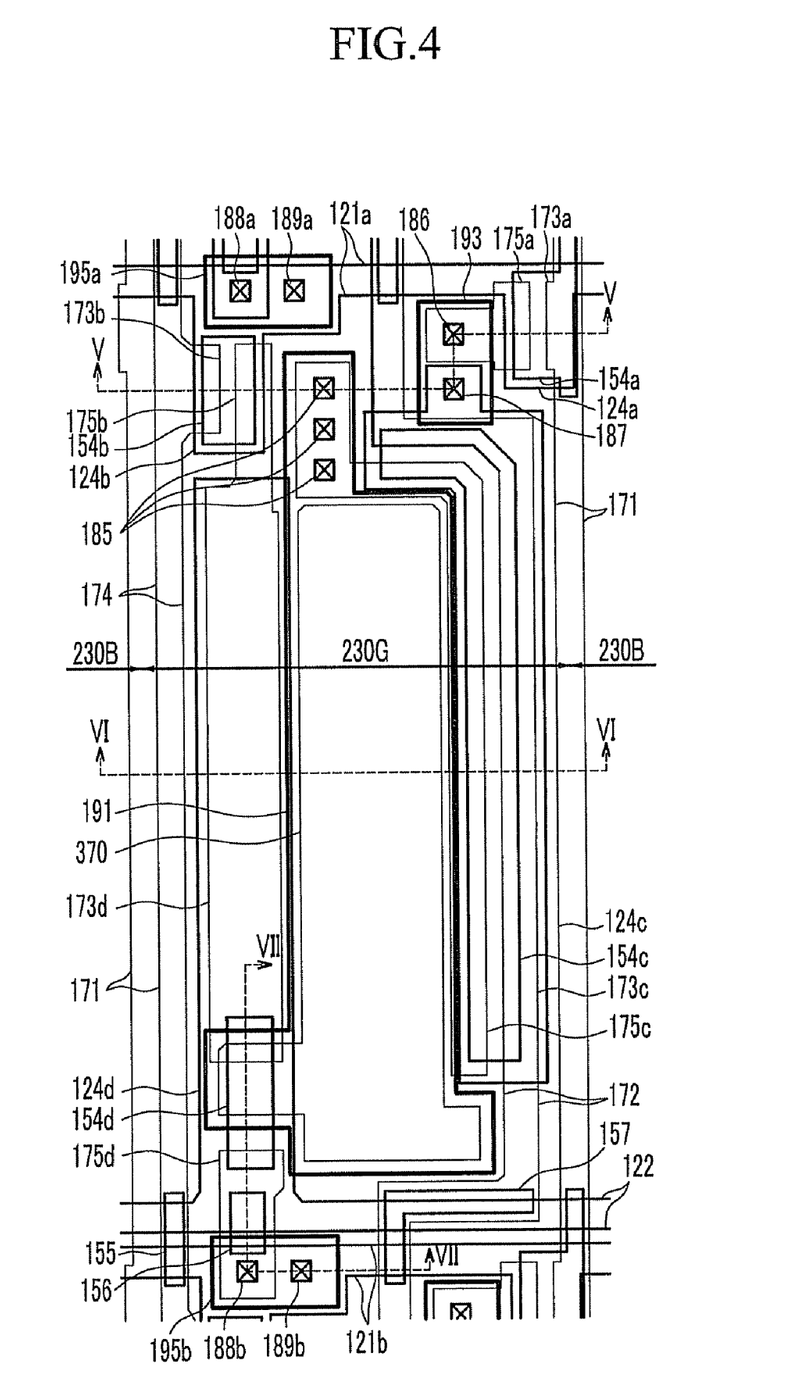
FIG. 4 is a plan view layout showing a portion of an exemplary embodiment of the OLED display shown in FIG. 3.

FIG. 3 is a plan view showing the pixel arrangement of the OLED display according to the an exemplary embodiment of the present invention, FIG. 4 is a plan view layout showing a portion of the OLED display shown in FIG. 3, and FIGS. 5 to 7 are cross-sectional views of the OLED display shown in FIG. 3 taken along lines V-V, VI-VI and VII-VII, respectively.

Referring to FIG. 3, the OLED display according to an exemplary embodiment of the present invention has a plurality of pixels arranged in a matrix shape. The individual pixels are divided according to types of emitted light. The individual pixels are divided into four pixels, each emitting light of one of red R, green G, blue B or white W color. A basic pixel unit is formed by four pixels arranged in a 2×2 matrix shape. The basic pixel unit is repeatedly disposed in the row direction and column direction. In the basic pixel unit, the red pixel R and the blue pixel B diagonally face each other, and the green pixel G and white pixel W diagonally face each other. The organic light emitting diode ("OLED") display exhibits exceptional color characteristics when the green pixel G and the white pixel W diagonally face each other.

FIG. 4 shows the dotted line region including one green pixel G and portions of two adjacent blue pixels B, shown in FIG. 3. Referring to FIG. 4, a plurality of gate conductors include a plurality of scanning signal lines 121a and 121b each having first and second control terminal electrodes 124a and 124b, a plurality of third control terminal electrodes 124c, and a plurality of control voltage lines 122 having fourth control terminal electrodes 124*d* are formed on an insulation substrate 110, formed of a transparent glass or a plastic. For clarity, a scanning signal line of a pixel row next to the pixel row in which the scanning signal line 121*a* is formed is represented by reference numeral 121*b*.

Still referring to FIG. 4, the scanning signal line 121*a* and the control voltage line 122 respectively transmit the scanning signal and the control voltage Vneg, and substantially extend in a horizontal direction. The first and second control terminal electrodes 124*a* and 124*b* respectively extend downward on the right and the left sides of the scanning signal line 121*a*. The third control terminal electrode 124*c* is separated from the scanning signal line 121*a* and the control voltage line 122, substantially extends in a vertical direction, and has a wide portion. The fourth control terminal electrode 124*d* extends upward from the control voltage line 122 and has a wide area.

The gate conductors 121*a*, 121*b*, 122 and 124*c* may be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), titanium (Ti), or tantalum (Ta). However, the gate conductors may have a multi-layered structure including two conductive layers (not shown) having different physical properties. Of these layers, one conductive layer is formed of a metal having low resistivity, such as an aluminum-based metal, a silver-based metal, or a copper-based metal, in order to reduce signal delay or voltage drop. In contrast, the other conductive layer is formed of a different material, particularly, a material having excellent physical, chemical and electrical contact characteristics similar to indium tin oxide ("ITO") and indium zinc oxide ("IZO"), or such as, a molybdenum-based metal, chromium, titanium, or tantalum. Specific examples of the combination include a combination of a chromium lower layer and an aluminum (alloy) upper layer, and a combination of an aluminum (alloy) lower layer and a molybdenum (alloy) upper layer. Moreover, the gate conductors 121*a*, 121*b*, 122 and 124*c* may be formed of various metals or conductors other than the above disclosed materials.

Figure 5:
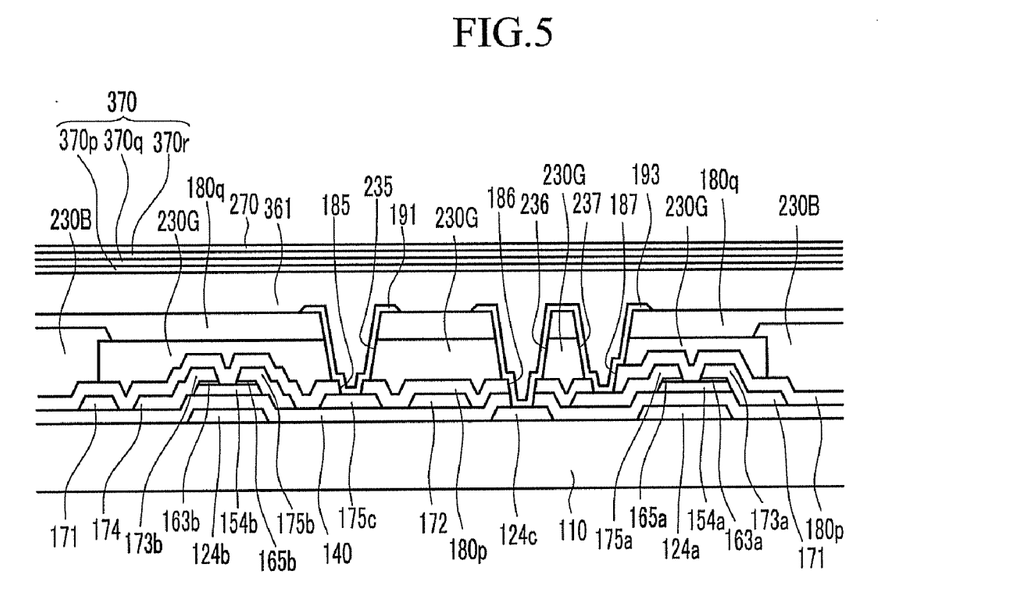
FIGS. 5 to 7 are cross-sectional views of an exemplary embodiment of the OLED display shown in FIG. 4 taken along lines V-V, VI-VI and VII-VII, respectively.
Figure 6:
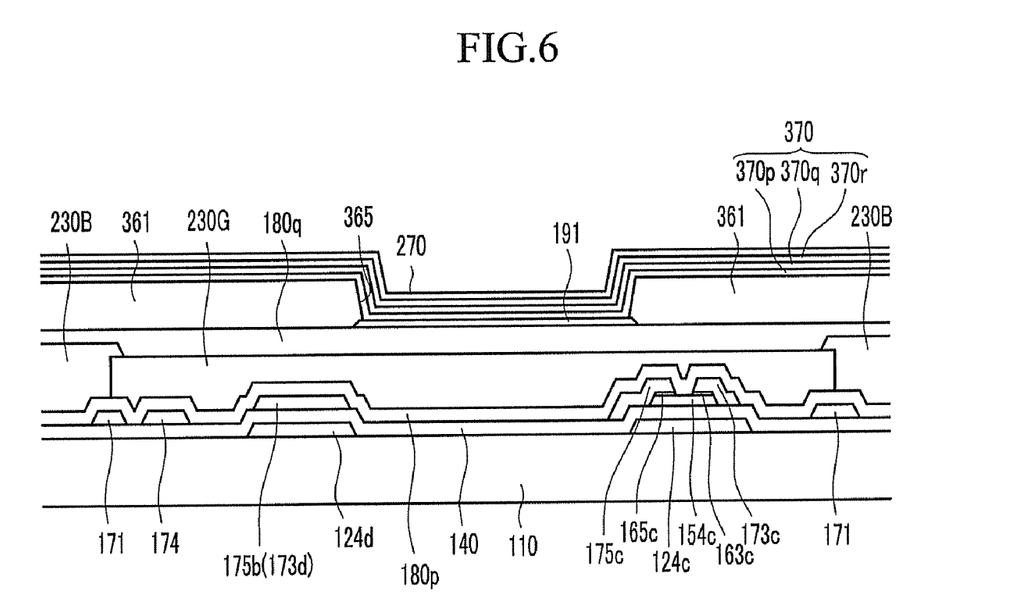
Figure 7:
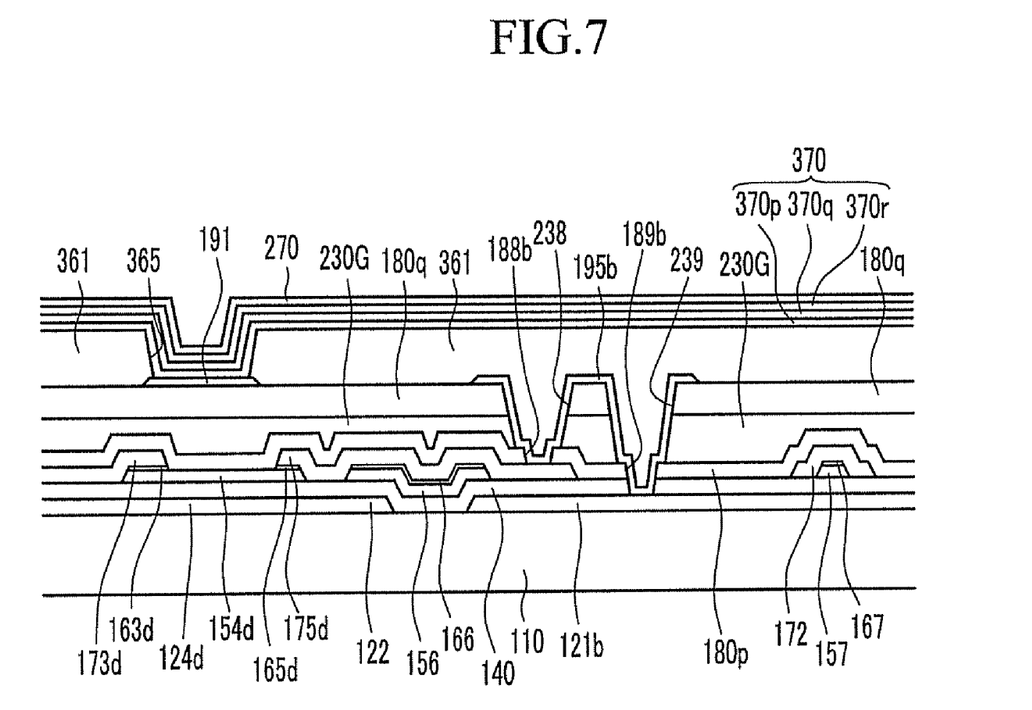

Referring to FIGS. 5 to 7, the lateral sides of the gate conductors 121*a*, 121*b*, 122 and 124*c* are inclined with respect to a surface of the substrate 110, and the inclination angle is in a range of about 30 degrees to about 80 degrees. A gate insulating layer 140 formed of silicon nitride ("SiN$_x$") or silicon oxide ("SiO$_x$") is formed on the gate conductors 121*a*, 121*b*, 122 and 124*c*.

Referring to FIG. 4 to FIG. 7, a plurality of first to seventh semiconductor islands 154*a*, 154*b*, 154*c*, 154*d*, 155, 156 and 157, formed of hydrogenated amorphous silicon ("a-Si") or polycrystalline silicon, are formed on the gate insulating layer 140. The first to fourth semiconductor islands 154*a* to 154*d* are respectively positioned on the first to fourth control terminal electrodes 124*a* to 124*d*.

A plurality of pairs of first ohmic contacts 163*a* and 165*a*, second ohmic contacts 163*b* and 165*b*, third ohmic contacts 163*c* and 165*c*, and fourth ohmic contacts 163*d* and 165*d* are respectively formed on the first to fourth semiconductor islands 154*a* to 154*d*. Ohmic contacts 166 and 167 are also formed on the semiconductor islands 155 to 157. The ohmic contacts 163*a* to 163*d*, 165*a* to 165*d*, 166 and 167 are formed in island shapes, and may be formed of a material, such as n+ hydrogenated amorphous silicon, in which an n-type impurity is doped with high concentration, or silicide. The first to fourth ohmic contacts 163*a*, 165*a*, 163*b*, 165*b*, 163*c*, 165*c*, 163*d* and 165*d* are respectively disposed on the first to fourth semiconductor islands 154*a* to 154*d* in pairs.

Side surfaces of the semiconductor islands 154*a* to 154*d*, 155 to 157 and the ohmic contacts 163*a* to 163*d*, 165*a* to 165*d*, 166 and 167 are inclined with respect to the surface of the substrate 110, and the inclination angle is in a range of about 30 degrees to about 80 degrees.

A plurality of data conductors which include a plurality of image data lines 171, a plurality of driving voltage lines 172, a plurality of sensing data lines 174, and a plurality of first to fourth output terminal electrodes 175*a*, 175*b*, 175*c* and 175*d* are formed on the ohmic contacts 163*a* to 163*d*, 165*a* to 165*d*, 166, and 167 and the gate insulating layer 140.

Referring to FIG. 4, the image data lines 171 and the sensing data lines 174 respectively transmit the image data voltage and the sensing reference voltage, and substantially extend in the vertical direction so as to cross the scanning signal lines 121*a* and the control voltage lines 122. Each of the image data lines 171 and each of the sensing data lines 174 respectively include a plurality of first and second input terminal electrodes 173*a* and 173*b* which extend toward the first and second control terminal electrodes 124*a* and 124*b*, respectively.

The driving voltage lines 172 transmit the driving voltage Vdd, and substantially extend in the vertical direction so as to cross the scanning signal lines 121*a* and the control voltage lines 122. Each of the driving voltage lines 172 includes a third input terminal electrode 173*c* which extends toward the third control terminal electrode 124*c*, as illustrated in FIGS. 4 and 6. The driving voltage lines 172 may overlap and may be connected to the third control terminal electrodes 124*c*.

Referring to FIG. 4 to FIG. 7, the first to the fourth output terminal electrodes 175*a* to 175*d* are separated from one another, and are also separated from the image data lines 171, the sensing data lines 174 and the driving voltage lines 172. The second output terminal electrodes 175*b* each include a fourth input terminal electrode 173*d*, and they extend in the vertical direction, as illustrated in FIG. 4, so as to overlap the fourth control terminal electrodes 124*d* (FIG. 6). The third output terminal electrodes 175*c* substantially extend in the vertical direction along the driving voltage lines 172, as illustrated in FIG. 4, so as to overlap the third control terminal electrodes 124*c* (FIG. 6). The fourth output terminal electrodes 175*d* extend downward above the fourth control terminal electrodes 124*d* and reach the scanning signal lines 121*b*.

Referring to FIGS. 5 and 6, the first input terminal electrodes 173*a* and the first output terminal electrodes 175*a* face each other with the first control terminal electrodes 124*a* as a center, and the second input terminal electrodes 173*b* and the second output terminal electrodes 175*b* face each other with the second control terminal electrodes 124*b* as a center. Further, the third input terminal electrodes 173*c* and the third output terminal electrodes 175*c* face each other with the third control terminal electrodes 124*c* as a center, and the fourth input terminal electrodes 173*d* and the fourth output terminal electrodes 175*d* face each other with the fourth control terminal electrodes 124*d* as a center, as illustrated in FIG. 6.

In exemplary embodiments, the data conductors 171, 172, 174, and 175*a* to 175*d* are formed of a refractory metal, such as molybdenum, chromium, tantalum, or titanium, or an alloy thereof. The data conductors may have a multi-layered structure of a refractory metal layer (not shown) and a low-resistance conductive layer (not shown). Examples of the multi-layered structure include a double-layered structure of a chromium or molybdenum (alloy) lower layer and an aluminum (alloy) upper layer, and a triple-layered structure of a molybdenum (alloy) lower layer, an aluminum (alloy) intermediate layer, and a molybdenum (alloy) upper layer. However, the data conductors 171, 172, 174, and 175a to 175d may be formed of various metals or conductors other than the above disclosed materials.

Like the gate conductors 121a, 121b, 122 and 124c, the lateral sides of the data conductors 171, 172, 174, and 175a-175d are also inclined with respect to the surface of the substrate 110 at an angle of about 30 degrees to about 80 degrees, as illustrated in FIGS. 5. to 7.

Referring to FIGS. 5 to 7, the ohmic contacts 163a to 163d, 165a to 165d, 166 and 167 are provided only between the underlying semiconductor islands 154a to 154d and 155 to 157 and the overlying data conductors 171, 172, 174 and 175a to 175d, so as to reduce contact resistance there between. The semiconductor islands 154a and 155 to 157 which are disposed on the scanning signal lines 121a/121b and the control voltage lines 122 have a smooth surface profile to prevent disconnection of the data conductors 171, 172, 174 and 175d The semiconductor islands 154a to 154d have exposed portions which are not covered with the input terminal electrodes 173a to 173d and the output terminal electrodes 175a to 175d.

A passivation layer 180p is formed on the data conductors 171, 172, 174, and 175a to 175d, the exposed portions of the semiconductor islands 154a to 154d, and the gate insulating layer 140. The passivation layer 180p is formed of an inorganic insulator, such as silicon nitride or silicon oxide, an organic insulator, or an insulator having a low dielectric constant. The organic insulator and the insulator having a low dielectric constant preferably have a dielectric constant of 4.0 or less. Examples of the organic insulators may include a-Si:C:O and a-Si:O:F, which are formed by a plasma enhanced chemical vapor deposition ("PECVD") method. The passivation layer 180p may be formed of an organic insulator which is photosensitive and the surface of the passivation layer 180p may be planarized. The passivation layer 180p may have a double-layered structure of a lower inorganic layer and an upper organic layer so as to use the exceptional insulative characteristics of an organic layer and to prevent the exposed portions of the semiconductor islands 154a to 154d from being damaged.

Referring to FIGS. 4 to 7, a plurality of contact holes 186, 185 and 188a/188b are formed in the passivation layer 180p so as to respectively expose the first, the third and the fourth output terminal electrodes 175a, 175c and 175d, and a plurality of contact holes 187, 189a and 189b are formed in the passivation layer 180p and the gate insulating layer 140, so as to respectively expose the third input terminal electrode 124c and the scanning signal lines 121a and 121b.

A plurality of color filters 230 are formed on the passivation layer 180p. The color filters 230 extend in a longitudinal direction, as illustrated in FIG. 4, along a column of pixel electrodes 191 in strip shapes, and two adjacent color filters 230 overlap each other above the image data lines 171, as illustrated in FIG. 5. The overlapping color filters 230 are formed of organic layers, so as to insulate the pixel electrodes 191 from the image data lines 171. Further, the overlapping color filters 230 may function as a light blocking member for preventing light from leaking between the pixel electrodes 191. In this case, a light blocking member on the common electrode panel may be omitted, and thus a manufacturing process can be simplified.

As illustrated in FIG. 5 and FIG. 7, through holes 235, 236, 237, 238 and 239, through which the contact holes 185, 186, 187, 188a, 188b, 189a and 189b, respectively, pass, are formed in the color filters 230, and the through holes 235, 236, 237, 238 and 239 are larger than the contact holes 185, 186, 187, 188a, 188b, 189a and 189b. The color filters 230 do not exist in a peripheral area where end portions (not shown) of the scanning signal lines 121 and end portions (not shown) of the image data lines 171 are positioned.

Each of the color filters 230 may display one of three primary colors, such as red, green, and blue. That is, in FIG. 3, a color filter which represents red is provided in the red pixel R, a color filter 230G which represents green is provided in the green pixel G, and a color filter 230B which represents blue is provided in the blue pixel B. Meanwhile, no color filter is provided in the white pixel W.

An overcoat 180q is formed on the color filters 230, as illustrated in FIG. 7. The overcoat 180q, which may provide a planarized surface, may be formed of an organic insulator, and prevents the color filters 230 from being exposed. The overcoat 180q may be omitted.

Referring to FIGS. 4 to 7, a plurality of pixel electrodes 191 and a plurality of connecting members 193, 195a, and 195b are formed on the overcoat 180q. The pixel electrodes 191 may be formed of a transparent material, such as ITO or IZO, or a reflective metal, such as aluminum, silver, or an alloy thereof.

The pixel electrodes 191 are physically and electrically connected to the third output terminal electrodes 175c through the contact holes 185. The connecting members 193 are connected to the first output terminal electrodes 175a and the third control terminal electrodes 124c through the contact holes 186 and 187, and the connecting members 195a are connected to the fourth output terminal electrodes 175d and the scanning signal lines 121a of the previous pixel row, through the contact holes 188a and 189a. Further, the connecting members 195b are connected to the fourth output terminal electrodes 175d and the next scanning signal lines 121b through the contact holes 188b and 189b.

A partition 361 is formed on the passivation layer 180q. The partition 361 surrounds an edge of the pixel electrodes 191 in a bank shape so as to define openings 365 and is formed of an organic insulator or an inorganic insulator. The partition 361 may also be formed of photoresist, which may include a black pigment. In this case, the partition 361, formed by a simple process, functions as a light blocking member.

Organic light emitting members 370 are formed in the openings 365 on the pixel electrodes 191, which is defined by the partition 361 and by all or a part of the partition 361, as illustrated in FIG. 7. The organic light emitting members 370 may emit white light. The organic light emitting members 370 include a first layer 370p, a second layer 370q, and a third layer 370r, formed of organic materials uniquely emitting light of different colors. Each of the first to third layers 370p to 370r may be formed of an organic material uniquely emitting light of one of three primary colors, such as red, green, and blue. In one embodiment, the first layer 370p emits blue light, the second layer 370q emits green light, and the third layer 370r emits red light.

In an embodiment, the organic light emitting members 370 may be formed only in the openings 365 on the pixel electrodes 191 defined by the partition 361.

Each entire organic light emitting member 370, having the first to third layers 370p to 370r, synthesizes the light of three colors so as to emit white light. Accordingly, the pixel R having the red color filter represents red, the pixel G having the green color filter 230G represents green, and the pixel B having the blue color filter 230B represents blue. The pixel W having no color filter represents white. Consequently, the organic light emitting diode ("OLED") display displays desired images by a spatial sum of color light of primary colors emitted from the color filters 230 and the organic light emitting members 370.

However, the present invention is not limited to this exemplary embodiment. In exemplary embodiments, the organic light emitting members 370 may have two layers emitting light of orange and sky blue or may have one layer formed of a material emitting white light. In further exemplary embodiments, the layers 370p to 370r of the organic light emitting members 370 may be horizontally laminated, with reference to FIGS. 5 to 7.

In exemplary embodiments, the organic light emitting members 370 may have a multi-layered structure including an auxiliary layer (not shown) for improving light-emission efficiency of the light-emitting layer, in addition to the light emitting layer (not shown) emitting light. The auxiliary layer may include an electron transport layer (not shown), a hole transport layer (now shown) for balancing electrons and holes, an electron injection layer (not shown), and a hole injection layer (not shown) for reinforcing the injection of the electrons and holes.

A common electrode 270, to which a common voltage Vcom is applied, is formed on the partition 361 and on the organic light emitting members 370, as illustrated in FIG. 7. The common electrode 270 is formed of a reflective metal, such as calcium (Ca), barium (Ba), magnesium (Mg), aluminum (Al), or silver (Ag), or a transparent conductive material, such as ITO or IZO.

As described above, since the color filters 230 or the overcoat 180q are formed on the passivation layer 180p, it is possible to prevent a short circuit between the pixel electrodes 191 and the common electrode 270 due to the fourth input terminal electrodes 173d, the fourth output terminal electrodes 175d, the fourth semiconductor islands 154d, and the fourth control terminal electrodes 124d, which are formed below the passivation layer 180p, as illustrated in FIG. 7. Therefore, short circuits between the pixel electrodes 191 and the common electrode 270 is reduced, or effectively prevented by the structure below the passivation layer 180p. The common electrode 270 serves as a cathode. Alternatively, the pixel electrodes 191 may serve as a cathode, and the common electrode 270 may serve as an anode. The third control terminal electrodes 124c, the driving voltage lines 172, and the third output terminal electrodes 175c, which overlap one another, form the first capacitors C1, and the fourth control terminal electrodes 124d, the second output terminal electrodes 175b, and the fourth input terminal electrodes 173d which overlap one another, form the second capacitors C2, as illustrated in FIG. 5.

The organic light emitting diode ("OLED") display displays images by emitting light above or below the substrate 110. Non-transparent pixel electrodes 191 and a transparent common electrode 270 are applied to a top emission type OLED display which displays images above the substrate 110, as illustrated in FIG. 7) Meanwhile, transparent pixel electrodes 191 and a non-transparent common electrode 270 are applied to a bottom emission type OLED display which displays images below the substrate 110.

At least a part of the fourth semiconductor islands 154d overlaps the organic light emitting members 370 and is exposed to light emitted from the organic light emitting members 370. However, the first to third semiconductor islands 154a to 154c are covered with the partition 361 and are blocked from light emitted from the organic light emitting members 370, as illustrated in FIG. 7.

Meanwhile, when each of the semiconductor islands 154a to 154d and 155 to 157 is formed of polysilicon, it includes an intrinsic region (not shown) facing a corresponding region of the control terminal electrodes 124a to 124d and extrinsic regions (not shown) positioned on both sides of the intrinsic region. The extrinsic regions may be electrically connected to a corresponding region of the input terminal electrodes 173a to 173d and a corresponding region of the output terminal electrodes 175a to 175d. The ohmic contacts 163a to 163d and 165a to 165d may be omitted.

The control terminal electrodes 124a to 124d may be disposed on the semiconductor islands 154a to 154d, respectively. In this case, the gate insulating layer 140 is also positioned between the semiconductor islands 154a to 154d and the control terminal electrodes 124a to 124d. At this time, the data conductors 171, 172, 174 and 175a to 175d may be positioned on the gate insulating layer 140 and may be electrically connected to the semiconductor islands 154a to 154d through the contact holes (not shown) formed in the gate insulating layer 140. In contrast, the data conductors 171, 172, 174 and 175a to 175b may be positioned below the semiconductor islands 154a to 154d and may be electrically connected to the overlying semiconductor islands 154a to 154d.

Referring to FIG. 1, the gray voltage generator 700 generates a gray voltage set (e.g. a reference gray voltage set) related to luminance of the pixels PX on the basis of gamma control data ("GCD") from the signal controller 600. The GCD is a digital value corresponding to an image data voltage (hereinafter referred to as the maximum image data voltage) for the maximum gray level. In contrast, the GCD may have a plurality of digital values corresponding to the gray voltage, and the digital values may be stored in a lookup table (not shown). In addition, the gray voltage generator 700 may independently generate a gray voltage on the basis of a separate gamma curve for every primary color. In this case, GCD may also be defined for every primary color.

Referring to FIG. 1, the scanning driver 400 is connected to the scanning signal lines $G_1$ to $G_{n+1}$ of the display panel 300 and applies scanning signals which are obtained by combining a gate-on voltage Von and a gate-off voltage Voff for turning on and off the first and the second switching transistors Qs1 and Qs2 to the scanning signal lines $G_1$ to $G_{n+1}$.

Referring to FIG. 1, the image data driver 500 is connected to the image data lines $D_1$ to $D_m$ of the display panel 300. The image data driver 500 selects a gray voltage from the gray voltage generator 700 and applies the selected gray voltage to the image data lines $D_1$ to $D_m$ as the image data voltage. When the gray voltage generator 700 does not supply voltages for all gray levels but instead supplies only a predetermined number of reference gray voltages, the image data driver 500 divides the reference gray voltages, generates gray voltages for all the gray levels, and selects the image data voltage among them.

Referring to FIG. 1, the luminance detector 800 is connected to the sensing data lines $P_1$ to $P_m$ of the display panel 300 and applies the sensing reference voltage to the sensing data lines $P_1$ to $P_m$. The sensing reference voltage is applied to the second capacitor C2 through the second switching transistor Qs2, and the second capacitor C2 which is discharged to a predetermined voltage is re-charged with the sensing reference voltage. The luminance detector 800 detects a voltage charged in the second capacitor C2 (e.g., a differential voltage between the sensing reference voltage and the predetermined voltage), performs a predetermined signal processing on the detected voltage so as to generate digital luminance information ("DSN"), and then transmits the digital luminance information to the signal controller 600. Here, the detected voltage corresponds to luminance represented by the organic light emitting diode ("OLED") LD. The luminance detector 800 may detect a current flowing into or the amount of charges accumulated in the second capacitor C2, so as to obtain the luminance information.

The signal controller 600 controls the scanning driver 400, the image data driver 500, the luminance detector 800, and the like.

The driving devices 400, 500, 600, 700 and 800 may be directly mounted on the display panel 300 as at least one IC chip or may be mounted on a flexible printed circuit film (not shown) and attached to the display panel 300 as a tape carrier package ("TCP"). Further, each driving device may be mounted on a separate printed circuit board (not shown). Further, each of the driving devices 400, 500, 600, 700 and 800 may be integrated with the display panel 300, together with the signal lines $G_1$ to $G_{n+1}$ and $D_1$ to $D_m$, the thin film transistors Qs1, Qs2, Qd and Qp, and the like. In addition, the driving devices 400, 500, 600, 700 and 800 may be integrated into a single chip. In this case, at least one of the driving devices or at least one circuit element of the driving devices may be provided outside the single chip.

The operation of the organic light emitting diode ("OLED") display will now be described in more detail.

The signal controller 600 receives input image signals R, G, and B and input control signals for controlling display thereof from an external graphic controller (not shown). The input image signals R, G, and B have luminance information of each pixel PX and the luminance has a predetermined number of gray levels (e.g. $1024(=2^{10})$, $256(=2^8)$ or $64(=2^6)$). Examples of the input control signals may include a vertical synchronizing signal Vsync, a horizontal synchronizing signal Hsync, a main clock MCLK and a data enable signal DE.

The signal controller 600 appropriately processes the input image signals R, G and B on the basis of the input image signals R, G and B and the input control signals according to the operation conditions of the display panel 300 and the image data driver 500. The signal controller 600 also generates a scanning control signal CONT1, an image data control signal CONT2, a luminance sensing control signal CONT3, and the gamma control data GCD. Then, the signal controller 600 outputs the scanning control signal CONT1 to the scanning driver 400, and outputs the image data control signal CONT2 and a processed image signal DAT to the image data driver 500. The output image signal DAT is a digital signal and has a predetermined number of values (or gray levels). Further, the signal controller 600 outputs the luminance sensing control signal CONT3 to the luminance detector 800, and outputs the GCD to the gray voltage generator 700.

The scanning control signal CONT1 includes a scanning start signal STV for instructing to start scanning and at least one clock signal for controlling an output cycle of the gate-on voltage Von. The scanning control signal CONT1 may further include an output enable signal OE for defining the duration of the gate-on voltage Von.

The image data control signal CONT2 includes a horizontal synchronization start signal STH for informing the start of transmission of the image signals DAT for one row of pixels PX, a load signal LOAD for instructing to apply the image data voltages to the image data lines $D_1$ to Dm, and a data clock signal HCLK.

The image data driver 500 receives the image signals DAT for one row of pixels PX according to the image data control signal CONT2 from the signal controller 600, and selects the gray voltages corresponding to the image signals DAT. Then, the data driver 500 converts the image signals DAT into the analog data voltages, and applies the converted analog data voltages to the image data lines $D_1$ to $D_m$. In contrast, the image data driver 500 may divide the reference gray voltages from the gray voltage generator 700, generate the gray voltages by itself, and apply the generated gray voltages to the image data lines $D_1$ to $D_m$ as the image data voltages.

The scanning driver 400 applies the gate-on voltage Von to the scanning signal lines $G_1$ to $G_{n+1}$ according to the scanning control signal CONT1 from the signal controller 600 and turns on the first switching elements Qs1 which are respectively connected to the scanning signal lines $G_1$ to $G_{n+1}$. Then, the image data voltage applied to each of the image data lines $D_1$ to $D_m$ is applied to the control terminal of the corresponding driving transistor Qd and the first capacitor C1 through the turned-on first switching transistor Qs1, and the first capacitor C1 charges the image data voltage. The voltage charged in the first capacitor C1 is maintained for one frame even though the scanning signal becomes the gate-off voltage Voff and the first switching transistor Qs1 is turned off. Accordingly, the voltage of the control terminal of the driving transistor Qd is kept constant.

The driving transistor Qd outputs the output current $I_{LD}$, the magnitude of which is controlled according to the image data voltage, to the organic light emitting diode ("OLED") LD. The OLED LD emits light with a different intensity according to the magnitude of the current $I_{LD}$, so as to display a corresponding image.

This process is repeated for every one horizontal period, which is also referred to as "1H" and is equal to one cycle of the horizontal synchronizing signal Hsync and the data enable signal DE. Then, the gate-on voltage Von is sequentially applied to all the scanning signal lines $G_1$ to $G_{n+1}$, and the image data voltages are applied to all the pixels PX, such that the images for one frame are displayed.

Here, the scanning signal line $G_{n+1}$ is connected to the sensor transistor Qp of the last pixel row but is not connected to the switching transistors Qs1 and Qs2. Accordingly, the gate-on voltage Von may not be applied to the scanning signal line $G_{n+1}$. However, in order to put the last pixel row in the same condition as the other pixel rows, the gate-on voltage Von may be applied.

Meanwhile, the luminance detector 800 applies the sensing reference voltage to the sensing data lines $P_1$ to $P_m$ according to the luminance sensing control signal CONT3 from the signal controller 600, as illustrated in FIG. 1.

When the scanning signal applied to one scanning signal line $G_i$ becomes the gate-on voltage Von, both the first switching transistor Qs1 and the second switching transistor Qs2 of the corresponding pixel row are turned on. The sensing reference voltage applied to the sensing data lines $P_1$ to $P_m$ is applied to the input terminal of the corresponding sensor transistor Qp and the second capacitor C2 through the turned-on second switching transistor Qs2, and the second capacitor C2 charges the sensing reference voltage.

After one horizontal period ("1H"), the scanning signal applied to the scanning signal line $G_i$ becomes the gate-off voltage Voff, and the scanning signal applied to the scanning signal line $G_{i+1}$ becomes the gate-on voltage Von. Then, since the second switching transistor Qs2 is turned off, the second capacitor C2 and the input terminal of the sensor transistor Qp are in a floating state, and the gate-on voltage Von is applied to the output terminal of the sensor transistor Qp.

After the next one horizontal period ("1H"), when the scanning signal applied to the scanning signal line $G_{i+1}$ becomes the gate-off voltage Voff, the voltage of the output terminal of the sensor transistor Qp becomes the gate-off voltage Voff. Then, the photocurrent of the sensor transistor Qp which is formed according to light emission of the OLED LD flows from the input terminal of the sensor transistor Qp to the output terminal, and the sensing reference voltage charged in the second capacitor C2 starts to be discharged. Then, in the next frame, the discharge continues until the gate-on voltage Von is applied to the scanning signal line $G_i$ again. At this time, the discharged voltage corresponds to the luminance represented by the OLED LD. When the scanning signal becomes the gate-on voltage Von, the sensing reference voltage applied to the sensing data lines $P_1$ to $P_m$ is re-charged in the second capacitor C2. Next, the luminance detector 800 detects the magnitude of a differential voltage between the voltage charged in the second capacitor C2, which is the remaining voltage after discharge according to the photocurrent and the sensing reference voltage, generates the digital luminance information DSN corresponding to the luminance represented by the OLED LD, and transmits the generated digital luminance information to the signal controller 600.

As illustrated in FIG. 1, the signal controller 600 generates the gamma control data GCD on the basis of a difference between target luminance and the measured luminance and outputs the GCD to the gray voltage generator 700. The GCD, on the basis of the difference between the target luminance and the measured luminance, may be stored in a lookup table (not shown) or the like and the measured luminance may be extracted from the digital luminance information DSN. In one exemplary embodiment, the maximum image data voltage may be set in a range of about 10 V to about 15 V. As the luminance decreases, the gray voltage increases by increasing the maximum image data voltage, thereby compensating the luminance. Further, the luminance may be compensated by changing the gray voltage itself. In addition, the luminance for each primary color may be separately compensated by separately measuring the luminance for each primary color.

As such, even though the change in threshold voltage is accompanied by a decrease in the luminance, the luminance may be compensated by measuring the luminance using the sensor transistor Qp or the like and changing the gray voltage.

Since the change in threshold voltage progresses for a long time, luminance detection and luminance compensation do not need to be performed for every frame. In exemplary embodiments, luminance detection and luminance compensation may be performed for every predetermined amount of time. Further, the luminance does not need to be detected for all of the pixels PX of the display panel 300. In exemplary embodiments, a sample pixel may be set, the luminance may be detected from the sample pixel, and subsequently the gamma control data GCD may be generated based on the detected luminance.

In exemplary embodiments, the second capacitor C2 is designed such that the second capacitor C2 may completely charge the sensing reference voltage for one horizontal period. Further, the sensor transistor Qp and the second capacitor C2 are preferably designed such that the voltage discharged according to the photocurrent is smaller than the sensing reference voltage. The sensing reference voltage and the gate-off voltage Voff are set such that the photocurrent flows from the input terminal of the sensor transistor Qp to the output terminal. In one exemplary embodiment, the sensing reference voltage may be set to approximately 5 V, and the gate-off voltage Voff may be set to approximately −8 V.

According to an exemplary embodiment of the present invention, an organic light emitting diode ("OLED") display which includes a photo sensing part is used as a device for compensating a change in the threshold voltage, so as to prevent a short circuit between the pixel electrodes and the common electrode. That is, a change in threshold voltage of an amorphous silicon thin film transistor can be compensated, and thus a structure for preventing degradation of image quality can be stably implemented.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A display device comprising:
   a plurality of light emitting elements which emit light when supplied with a driving current, each light emitting element including an organic light emitting layer which emits white light;
   a plurality of driving transistors which supply the driving current to the light emitting elements;
   a plurality of photo sensing parts which sense light amounts according to emission of the light from the light emitting elements and output sense signals according to the sensed light amounts; and
   a plurality of color filters which are disposed on the plurality of driving transistors and the plurality of photo sensing parts,
   wherein each of the color filters overlaps each of the photo sensing parts and the color filter is disposed between the light emitting elements and the photo sensing parts.

2. The display device of claim 1, further comprising an overcoat which is disposed on the plurality of color filters.

3. The display device of claim 1, wherein the organic light emitting layer comprises a first layer, a second layer and a third layer which emit light of different colors from each other.

4. The display device of claim 3, wherein the first layer, the second layer or the third layer emit light of one of red, blue and green.

5. The display device of claim 4, wherein the first layer emits blue light, the second layer emits green light and the third layer emits red light.

6. The display device of claim 1, wherein the each of the photo sensing parts comprises a sensor transistor which forms a photocurrent according to the emission of the light from the corresponding light emitting element.

7. The display device of claim 6, further comprising:
   a plurality of first capacitors which charge an image data voltage corresponding to the driving current; and
   a plurality of second capacitors which charge a sensing reference voltage and discharge a predetermined voltage corresponding to the photocurrent.

8. The display device of claim 7, further comprising:
   a plurality of first switching transistors which transmit the image data voltage to the first capacitors and the driving transistors according to scanning signals; and
   a plurality of second switching transistors which transmit the sensing reference voltage to the second capacitors and the sensor transistors according to the scanning signal.

9. The display device of claim 8, further comprising:
   a plurality of scanning signal lines which are respectively connected to the first and second switching transistors and transmit the scanning signals;
   a plurality of image data lines which are respectively connected to the first switching transistors and transmit the image data voltage; and
   a plurality of sensing data lines which are respectively connected to the second switching transistors and transmit the sensing reference voltage.

10. The display device of claim 9, further comprising a luminance detector which is connected to the sensing data lines so as to supply the sensing reference voltage to the sensing data lines, and detects the magnitude of a voltage charged in each of the second capacitors so as to generate luminance information about the light emitting element.

* * * * *